US009866162B2

(12) United States Patent
de Lamarre et al.

(10) Patent No.: US 9,866,162 B2
(45) Date of Patent: Jan. 9, 2018

(54) EXCITATION CIRCUIT OF A MOTOR VEHICLE ALTERNATOR, VOLTAGE REGULATOR, AND ALTERNATOR WHICH INCORPORATES IT

(71) Applicant: VALEO EQUIPEMENTS ELECTRIQUES MOTEUR, Creteil (FR)

(72) Inventors: Laurent de Lamarre, Paris (FR); Pierre Tisserand, Limeil Brevannes (FR); Pierre Sardat, Le Raincy (FR); Laurent Labiste, Saint Maur des Fossés (FR); Pierre Chassard, Creteil (FR); Guillaume Duthilleul, Salles (FR); Pierre-François Ragaine, Saints (FR); Romuald Morvany, Montigny le Bretonneux (FR); Jeremy Lagrange, Limeil Brevannes (FR)

(73) Assignee: Valeo Equipements Electriques Moteur (FR)

( * ) Notice: Subject to any disclaimer, the term of this patent is extended or adjusted under 35 U.S.C. 154(b) by 0 days.

(21) Appl. No.: 15/248,301

(22) Filed: Aug. 26, 2016

(65) Prior Publication Data

US 2017/0063265 A1 Mar. 2, 2017

(30) Foreign Application Priority Data

Aug. 28, 2015 (FR) ..................................... 15 57988

(51) Int. Cl.
*H02P 7/00* (2016.01)
*H02P 9/30* (2006.01)
(Continued)

(52) U.S. Cl.
CPC ................ *H02P 9/305* (2013.01); *B60L 1/00* (2013.01); *H02J 7/16* (2013.01); *H02J 7/242* (2013.01); *H02P 9/48* (2013.01); *H03K 17/687* (2013.01)

(58) Field of Classification Search
CPC .......... H02J 7/16; H02P 9/48; H02P 2101/45; H02P 6/32; H02P 9/305; H03K 17/08142; H03K 17/687
(Continued)

(56) References Cited

U.S. PATENT DOCUMENTS 7,224,145 B2 * 5/2007 Pierret ..................... F02N 11/04
322/25
8,143,824 B2 * 3/2012 Mitsuda ..................... H02P 3/18
318/376

(Continued)

FOREIGN PATENT DOCUMENTS

CN 103944426 A 7/2014
EP 2637293 A1 9/2013
(Continued)

*Primary Examiner* — Bentsu Ro
*Assistant Examiner* — Thai Dinh
(74) *Attorney, Agent, or Firm* — Berenato & White, LLC

(57) ABSTRACT

The excitation circuit according to the invention controls an excitation current (Iexc) in an excitation winding (2) of an alternator by means of an on-board network voltage control loop (Vbat+, 3) of the vehicle, and comprises a first MOS power transistor (9) which is connected between a first positive supply terminal Vbat+ (6), and a first excitation terminal (7), and is controlled by the control loop by means of a first control circuit (10), a second MOS power transistor (11), which is connected between the first excitation terminal and a second excitation terminal (8) which is connected to a ground terminal (5) and acts as a free wheel diode, whilst being controlled by means of a second control circuit (12). According to the invention, the circuit additionally (Continued)

comprises a control loop (15) of a drain-source voltage (Vds) of the second transistor.

17 Claims, 4 Drawing Sheets

(51) Int. Cl.
*H02J 7/16* (2006.01)
*H02J 7/24* (2006.01)
*B60L 1/00* (2006.01)
*H02P 9/48* (2006.01)
*H03K 17/687* (2006.01)

(58) Field of Classification Search
USPC ........ 318/154, 139, 712, 713, 716, 530, 536
See application file for complete search history.

(56) References Cited

U.S. PATENT DOCUMENTS

| | | | |
|---|---|---|---|
| 8,416,548 B2* | 4/2013 | Doffin | H03K 17/0822 |
| | | | 361/42 |
| 2005/0218964 A1 | 10/2005 | Oswald et al. | |
| 2013/0293176 A1* | 11/2013 | Koeppl | H02P 9/102 |
| | | | 318/502 |
| 2013/0313828 A1* | 11/2013 | Moreau | H02K 19/28 |
| | | | 290/44 |

FOREIGN PATENT DOCUMENTS

| | | |
|---|---|---|
| FR | 2733097 | 10/1996 |
| JP | 2007174788 A | 7/2007 |

\* cited by examiner

EXCITATION CIRCUIT OF A MOTOR VEHICLE ALTERNATOR, VOLTAGE REGULATOR, AND ALTERNATOR WHICH INCORPORATES IT

CROSS-REFERENCE TO RELATED APPLICATIONS AND CLAIM TO PRIORITY

This application is related to Patent Application No. 1557988 filed Aug. 28, 2015 in France, the disclosure of which is incorporated herein by reference and to which priority is claimed.

FIELD OF THE INVENTION

The present invention relates to an excitation circuit of a motor vehicle alternator, as well as to the voltage regulator and the alternator comprising this excitation circuit.

BACKGROUND OF THE INVENTION

In a motor vehicle alternator, an on-board network voltage is regulated by controlling an intensity of the magnetic flux, obtained from an excitation winding of a rotor, and passing through the windings of a stator. This function is ensured by an excitation circuit which adjusts a value of an excitation current of the rotor, according to the variations of loads and of the speed of rotation of the alternator.

An example of this type of excitation circuit is provided in the French patent application FR2733097 by the company VALEO EQUIPEMENTS ELECTRIQUES MOTEUR.

In order to limit losses by dissipation efficiently, the switching of an electronic power stage of this circuit is controlled at a fixed or variable frequency. A voltage at the terminals of the excitation winding is taken to the potential of the battery for a given time, then released until the end of the excitation period. In an established arrangement, a mean value of an excitation current is proportional to the ratio of a time in the high state to a period of an excitation signal. This duty cycle is determined by a control loop of a regulator.

When the excitation is released, the current in the rotor winding cannot be interrupted instantaneously.

The electronic power stage must provide a conduction path, in order to allow the rotor current to circulate freely. This function is conventionally carried out by a so-called "free wheel" diode which is placed in parallel on the excitation winding, and is activated naturally when the voltage at the terminals of the rotor becomes negative.

In order to prevent effects caused by the environment, such as corrosion or the appearance of saline bridges, the rotor winding is generally connected to the neutral potential of the alternator. The excitation stage of a regulator is thus constituted by:
  a power transistor which is connected between a positive terminal of the alternator, and a positive terminal of the excitation winding;
  a diode which is connected to the terminals of the excitation winding;
  an excitation control circuit.

In the case of integration in an integrated circuit, which at present mostly uses BCD technology, a first, high side switching element is a first power transmitter generally of the NMOS type. The free wheel diode is produced by using the base-emitter diode of a bipolar transistor. The disadvantage of the diode is to generate $Vf*If*Do$ losses.

Certain technologies use the intrinsic diode of an NMOS, with the transistor being maintained in the blocked state. Intrinsic diodes generally have less good performance than bipolar diodes.

A first control circuit of a first gate voltage of the first, high side transistor forms the interface with the logic of the control loop. This first control circuit must generate switching gradients so as to:
  control the form of the current switching in order to limit the EMC emissions on the on-board network;
  optimise the switching time in order to limit the switching losses.

Examples of gate control strategies which carry out this control are known in the prior art.

Since a second, low side switching element is available in BCDMOS technology, it is also known for persons skilled in the art to control it in opposition to the first, high side excitation transistor, such as to switch it on during the free wheel phases. The advantage of this solution is to have low conduction losses, associated with the decrease in the equivalent resistance (RDSon) between a source and a drain of the second, low side transistor.

However, in order to avoid simultaneous conduction of the two transistors, a control circuit must transmit control signals of the first gate voltage, and of a second gate voltage of the second transistor, which do not overlap. The control circuit must therefore generate dead times between the activations of the transistors.

A control circuit of this type also has the disadvantage of having a common mode between the commands of the high side and low side power transmitters, in particular during EMC tests, which can make it difficult to use in the motor vehicle industry.

SUMMARY OF THE INVENTION

An objective of the present invention is therefore to eliminate these disadvantages.

Its subject is in particular an excitation circuit of a motor vehicle alternator, of the type which can control an excitation current in an excitation winding of this alternator, according to a command of a voltage control loop of an on-board network of the vehicle which is supplied by a battery to which this alternator is connected.

The excitation circuit in question comprises at least:
  a first ground terminal, which is designed to be connected to a ground of the on-board network;
  a first supply terminal, which is designed to be connected to a positive line of the on-board network;
  first and second excitation terminals which are designed to be connected to the excitation winding;
and it comprises:
  a first power transistor of the MOS type, which is connected between the first supply terminal and the first excitation terminal, and can be controlled by the control loop by means of a first control circuit of a first gate voltage;
  a second power transistor of the MOS type, which is connected between the first and second excitation terminals, and to the first ground terminal which acts as a free wheel diode, whilst being controlled by means of a second control circuit of a second gate voltage.

According to the invention, this excitation circuit of a motor vehicle alternator additionally comprises a control loop of a drain-source voltage of the second power transistor.

Also according to the invention, this control loop comprises:

a return device which controls the drain-source voltage;
a device for generation of a reference voltage;
an error calculation device;
an error correction device;
the second control circuit.

According to the invention, the correction device is of the "proportional-integral" type.

In the excitation circuit of a motor vehicle alternator according to the invention, the second control circuit is an operational amplifier comprising a counter-reaction loop constituted by a first resistor and a capacitor in series.

According to the invention, the device for generation of a reference voltage is constituted by a current generator which is connected to an inverting input of the operational amplifier.

Also according to the invention, the return device is constituted by this operational amplifier, the inverting input being connected by a second resistor to the first excitation terminal, and a non-inverting input of this operational amplifier being connected to the second excitation terminal.

An output of the operational amplifier controls the second gate voltage according to the invention by means of a third resistor 27.

Alternatively, in the excitation circuit of a motor vehicle alternator according to the invention, the device for generation of a reference voltage is connected between a non-inverting input of the operational amplifier and the second excitation terminal.

The invention also relates to a vehicle voltage regulator which comprises an excitation circuit with the above characteristics.

The invention also concerns a motor vehicle alternator comprising a regulator of this type.

These few essential specifications will have made apparent to persons skilled in the art the advantages provided by the excitation circuit according to the invention, as well as the voltage regulator and the alternator which incorporates it, in comparison with the prior art.

The detailed specifications of the invention are given in the description which follows in association with the appended drawings. It should be noted that these drawings serve the purpose simply of illustrating the text of the description, and do not constitute in any way a limitation of the scope of the invention.

DETAILED DESCRIPTION OF THE PREFERRED EMBODIMENT(S)

Figure 1:
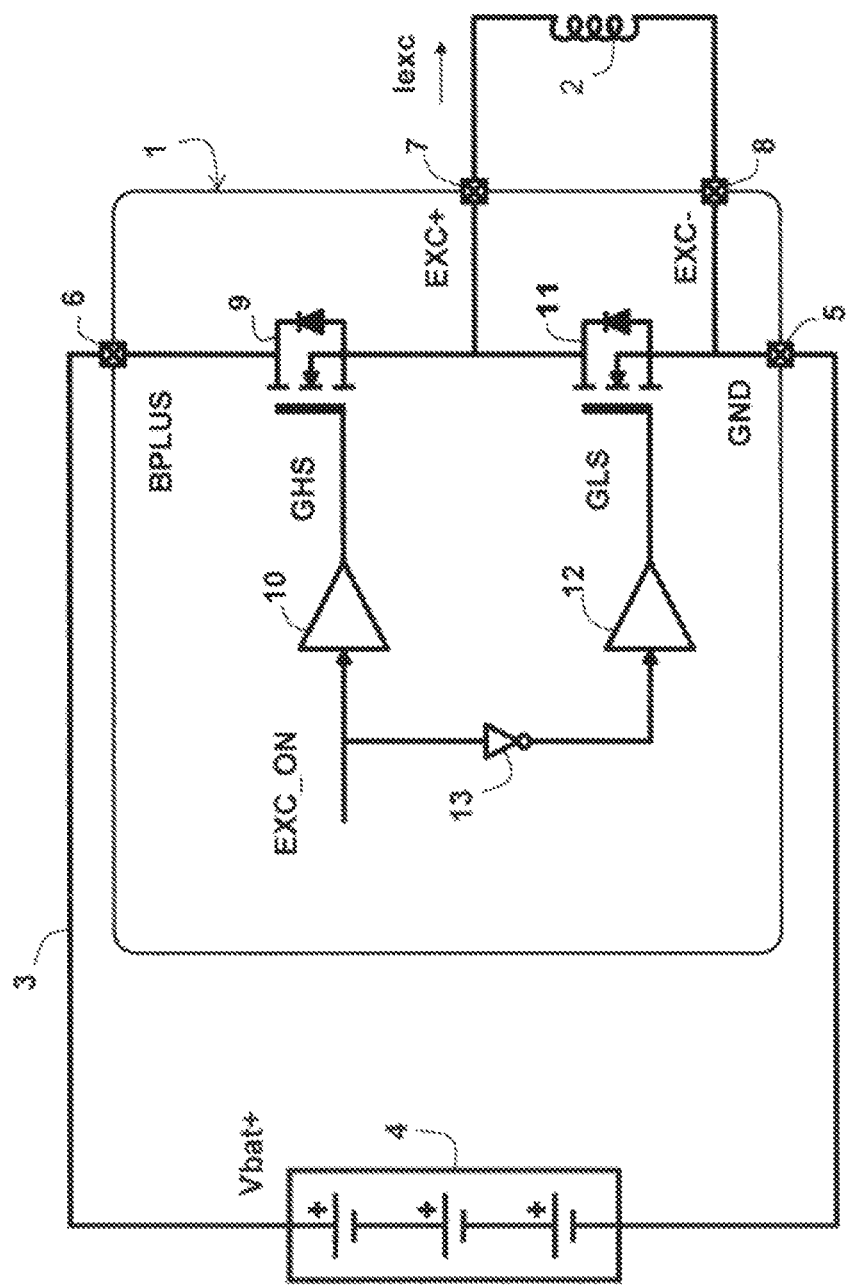
FIG. 1 is a process diagram of an excitation circuit of a motor vehicle alternator known in the prior art.

A diagram of an excitation circuit 1 of the type concerned by the invention is represented in FIG. 1.

This is an excitation circuit 1 of a voltage regulator of an alternator with excitation for an application in a motor vehicle known by the inventive body.

This excitation circuit 1 makes it possible to control an excitation current Iexc which circulates in an excitation winding 2 of the alternator according to a command EXC_ON of a control loop of a voltage Vbat+ of an on-board network 3 of the vehicle which is supplied by a battery 4.

The excitation circuit comprises in a known manner:
a first ground terminal 5, which is designed to be connected to a ground of the on-board network 3;
a first supply terminal 6, which is designed to be connected to a positive line Vbat+ of the on-board network 3;
first and second excitation terminals 7, 8, which are designed to be connected to the excitation winding 2.

As shown clearly in FIG. 1, this excitation circuit comprises:
a first power transistor 9 of the MOS type, which is connected between the first supply terminal 6 and the first excitation terminal 7, and can be controlled by the control loop by means of a first control circuit 10 of a first gate voltage GHS.
a second power transistor 11 of the MOS type, which is connected between the first and second excitation terminals 7, 8 and to the first ground terminal 5 which acts as a free wheel diode, whilst being controlled by means of a second control circuit 12 of a second gate voltage GLS.

In this excitation circuit 1 known in the prior art, the first and second gate voltages GHS, GLS are controlled in phase opposition by the command of the control loop EXC_ON by means of the inverter 13.

As already stated in the preamble, this excitation circuit 1 has numerous disadvantages, in particular in terms of electromagnetic compatibility (EMC).

For the purpose of reducing the switching losses, whilst complying with the EMC constraints, the inventive body proposes to reduce the conduction losses of the second power transistor 11 which acts as a free wheel diode, by combining a decrease in its equivalent resistance with autonomous control of the second gate voltage GLS without a mode in common with the control of the first gate voltage GHS of the first power transistor 9.

Figure 2:
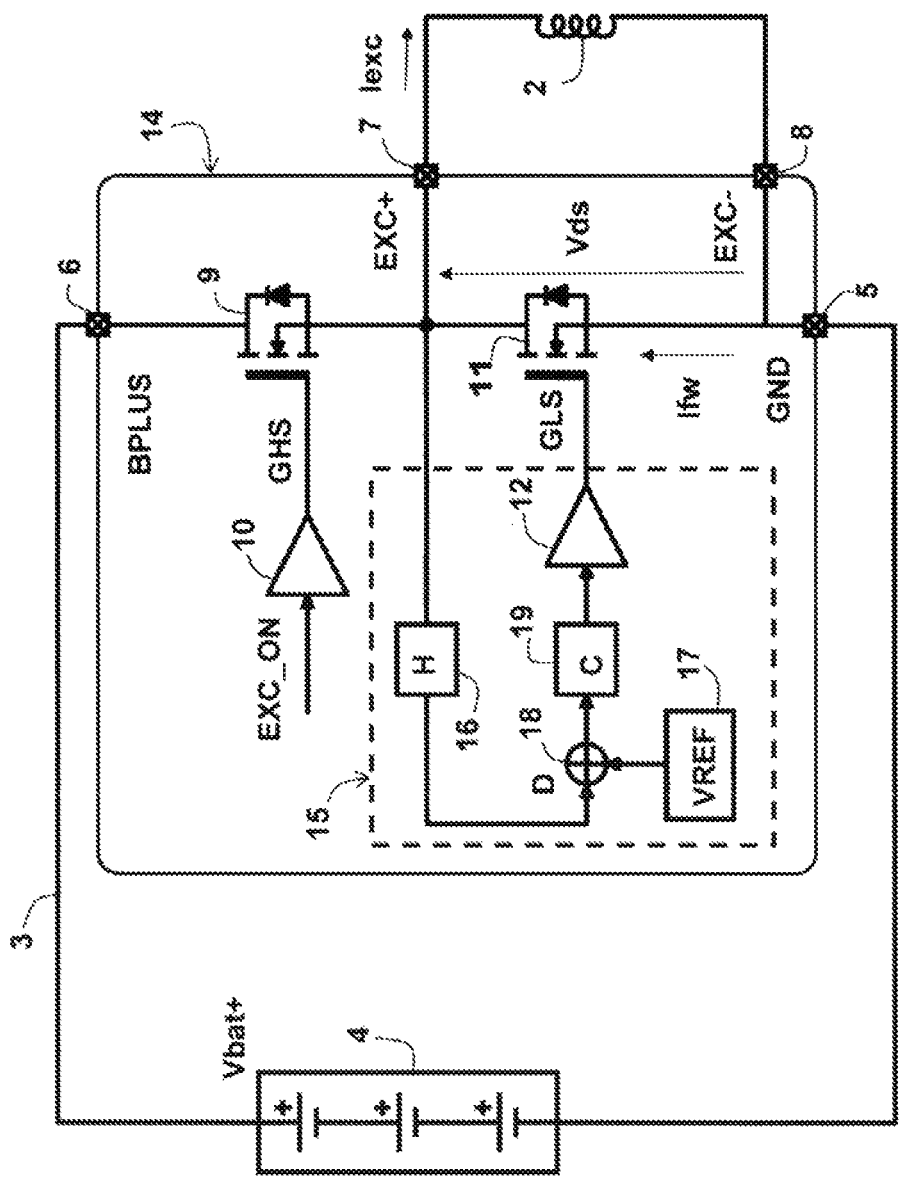
FIG. 2 is a general process diagram of an excitation circuit of a motor vehicle alternator according to the invention.

For this purpose, in the excitation circuit 14 according to the invention shown in FIG. 2, the second power transistor 11 is controlled such that it has the behaviour of a diode by means of a control loop 15 of a drain-source voltage Vds, which ensures both low losses and independence of the voltage.

The advantage of this solution is that the second power transistor 11 which acts as a free wheel diode effectively acts as a diode. It is therefore not necessary to modify the switching strategy by the control loop of the first power transistor 9.

The control loop 15 of the train-source voltage Vds is broken down functionally into:
a return device 16 which controls an input signal, i.e. the drain-source voltage Vds;
a device 17 for generation of a reference voltage VREF;
a device 18 for calculation of the error;
a device 19 for correction of the error;
the control circuit 12 of the second gate voltage GLS of the second power transistor 11.

In a free wheel phase, the break current Ifw of the excitation winding 2 of the rotor circulates firstly in the intrinsic diode of the second power transistor 11. The voltage at the terminals of this diode increases, then the control loop 15 will maintain this voltage close to the reference voltage VREF. When the break current lfw decreases, the control loop 15 will block this second power transistor 11. Functioning is then resumed, the characteristics of which are those of a diode, and are therefore independent from the control of the first gate voltage GHS of the first power transistor 9, with a controlled, very low, direct (forward) voltage of approximately 0.1 V, if the reference voltage is equal to 0.1 V, which makes it possible to reduce the conduction losses.

Figure 3:
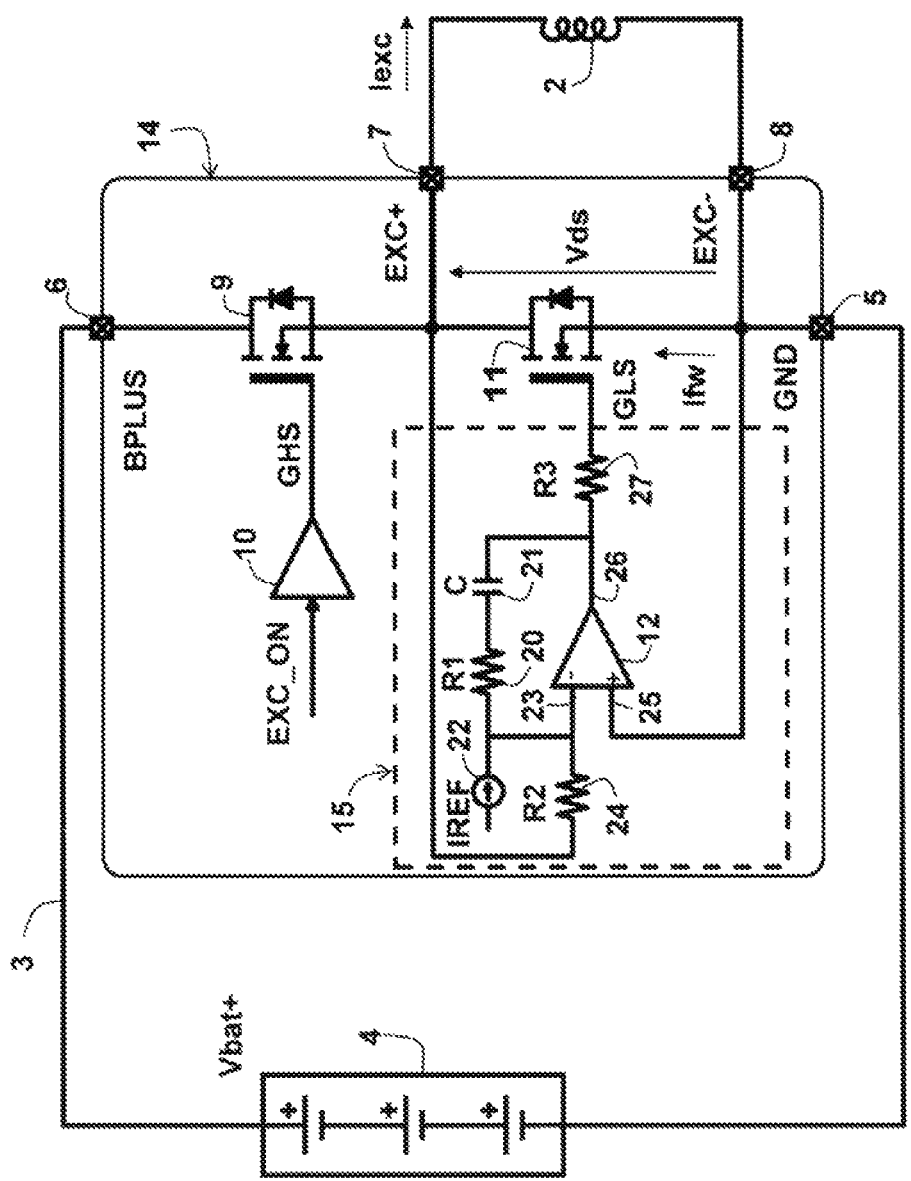
FIG. 3 is a process diagram of an excitation circuit according to the invention.

The process diagram of a preferred embodiment of the excitation circuit 14 according to the invention is given in FIG. 3.

The drain-source voltage Vds is controlled by the second control circuit 12, which is an operational amplifier 12 comprising a counter-reaction loop constituted by a first resistor 20 in series with a capacitor 21.

The reference voltage VREF is obtained by means of a current generator 22 which is connected to an inverting input 23 of the operational amplifier 12.

The inverting input 23 of the operational amplifier 12 is connected by a second resistor 24 to the first excitation terminal 7, a non-inverting input 25 being connected to the second excitation terminal 8.

An output 26 of the operational amplifier 12 controls the second gate voltage GLS of the second power transistor 11 by means of a third resistor 27.

A correction of the proportional integral (PI) type is thus used, which makes it possible to adjust the quality of the control. The third resistor 27, which is placed in series at the output of the operational amplifier 12, makes it possible to adjust the dynamics of the second power transistor 11.

As an alternative to the current generator 22, a reference source voltage 17 VREF, which is substantially equal to 0.1 V can be connected between the non-inverting input 25 of the operational amplifier 12 and the second excitation terminal 8, in order to adjust an offsetting voltage of the counter-reaction loop 20, 21.

Figure 4A:
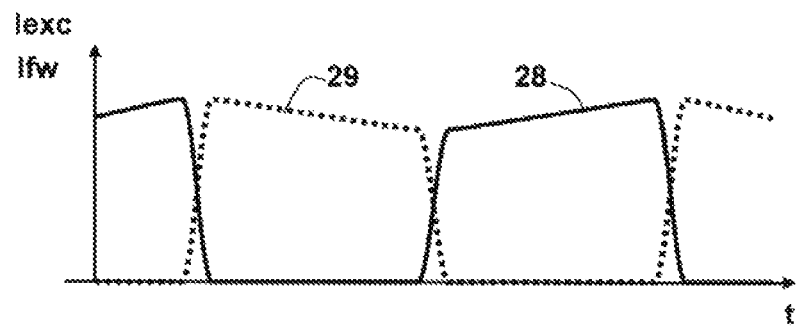
FIG. 4a consists of time diagrams of an excitation current (solid line) and a break current (broken line).
Figure 4B:
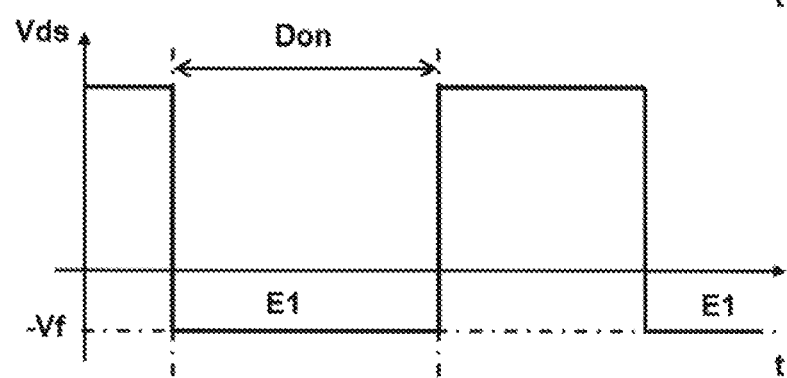
FIG. 4b is a time diagram of a break voltage at the terminals of a free wheel diode of an excitation circuit of a motor vehicle alternator known in the prior art.
Figure 4C:
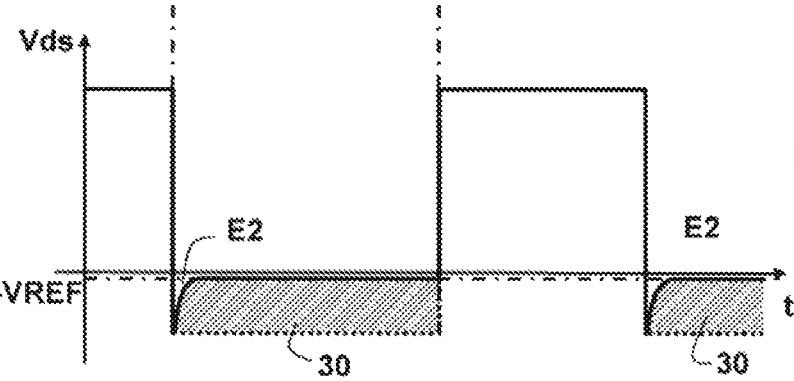
FIG. 4c is a time diagram of a drain-source voltage of the second power transistor of an excitation circuit of a motor vehicle alternator according to the invention.

As shown clearly in the time diagrams in FIGS. 4a, 4b and 4c, the gain in efficiency of the excitation circuit 14 according to the invention is directly associated with the relationship between a first threshold voltage Vf of the intrinsic diode of a known excitation circuit, and a second threshold voltage VREF of the free wheel diode which is equivalent to the second power transistor 11 in the excitation circuit 14 according to the invention.

FIG. 4a consists of time diagrams of the excitation current Iexc (solid line 28) circulating in the first power transistor 9, and of the break current lwf (broken line 29) circulating in the second power transistor 11, when the first power transistor 9 is open.

To these time diagrams 28, 29 of the currents Iexc, lfw, there correspond the time diagrams respectively for an excitation circuit known in the prior art (FIG. 4b), and for an excitation circuit according to the invention (FIG. 4c) of the drain-source voltage Vds of the second power transistor 11, which is equal to an excitation voltage Vexc imposed by the control loop, when the first power transistor 9 is on, and to a control voltage imposed by the control loop 15, when the first power transistor 9 is blocked.

FIG. 4b shows that the losses E1 caused by the break current lfw during the periods Don of the switching are equal to Vf*lfw*Don.

In the same conditions, FIG. 4c shows that the losses E2 caused by the break current lfw during the periods Don of the switching are equal to VREF*lfw*Don, i.e. the reduction of the losses is represented substantially by the hatched surface area 30.

As will be appreciated, the invention is not limited simply to the above-described preferred embodiments. In particular, the type of power transistors 9, 11 cited is non-limiting. Nor are the numerical values indicated limiting.

Other embodiments would not depart from the context of the present invention provided that they are derived from the following claims.

The invention claimed is:

1. Excitation circuit (1, 14) of a motor vehicle alternator, of the type which can control an excitation current (Iexc) in an excitation winding (2) of said alternator, according to a command (EXC_ON) of a voltage control loop (Vbat+) of an on-board network (3) of said vehicle which is supplied by a battery (4) to which said alternator is connected, comprising at least:
   a first ground (5) terminal, which is designed to be connected to a ground of said on-board network (3);
   a first supply terminal (6), which is designed to be connected to a positive line (Vbat+) of said on-board network (3);
   first and second excitation terminals (7, 8) which are designed to be connected to said excitation winding (2);
and comprising:
   a first power transistor (9) of the MOS type, which is connected between said first supply terminal (6) and said first excitation terminal (7), and can be controlled by said control loop by means of a first control circuit (10) of a first gate voltage (GHS);
   a second power transistor (11) of the MOS type, which is connected between said first and second excitation terminals (7, 8), and to said first ground terminal (5) which acts as a free wheel diode, whilst being controlled by means of a second control circuit (12) of a second gate voltage (GLS);
wherein it additionally comprises a control loop (15) of a drain-source voltage (Vds) of said second power transistor (11).

2. Excitation circuit (14) of a motor vehicle alternator according to claim 1, wherein said control loop (15) comprises:
   a return device (16) which controls said drain-source voltage (Vds);
   a device (17) for generation of a reference voltage (VREF);
   an error calculation device (18);
   an error correction device (19);
   said second control circuit (12).

3. Excitation circuit (14) of a motor vehicle alternator according to claim 2, wherein said correction device (19) is of the "proportional-integral" type.

4. Excitation circuit (14) of a motor vehicle alternator according to claim 3, wherein said second control circuit (12) is an operational amplifier comprising a counter-reaction loop constituted by a first resistor (20) and a capacitor (21) in series.

5. Excitation circuit (14) of a motor vehicle alternator according to claim 4, wherein said device (17) for generation of a reference voltage is constituted by a current generator (22) which is connected to an inverting input (23) of said operational amplifier (12).

6. Excitation circuit (14) of a motor vehicle alternator according to claim 5, wherein said return device (16) is constituted by said operational amplifier (12), said inverting input (23) being connected by a second resistor (24) to said first excitation terminal (7), and a non-inverting input (25) of said operational amplifier (12) being connected to said second excitation terminal (6).

7. Excitation circuit (14) of a motor vehicle alternator according to claim 6, wherein an output (26) of said operational amplifier (12) controls said second gate voltage (GLS) by means of a third resistor (27).

8. Vehicle voltage regulator, comprising an excitation circuit (14) according to claim 7.

9. Vehicle voltage regulator, comprising an excitation circuit (14) according to claim 6.

10. Vehicle voltage regulator, comprising an excitation circuit (14) according to claim 5.

11. Excitation circuit (14) of a motor vehicle alternator according to claim 4, wherein said device (17) for generation of a reference voltage (VREF) is connected between a non-inverting input (25) of said operational amplifier (12) and said second excitation terminal (8).

12. Vehicle voltage regulator, comprising an excitation circuit (14) according to claim 11.

13. Vehicle voltage regulator, comprising an excitation circuit (14) according to claim 4.

14. Vehicle voltage regulator, comprising an excitation circuit (14) according to claim 3.

15. Vehicle voltage regulator, comprising an excitation circuit (14) according to claim 2.

16. Vehicle voltage regulator, comprising an excitation circuit (14) according to claim 1.

17. Motor vehicle alternator, comprising a voltage regulator according to claim 16.

* * * * *